United States Patent
Kang et al.

(10) Patent No.: US 11,404,384 B2
(45) Date of Patent: Aug. 2, 2022

(54) INTERCONNECT STRUCTURE

(71) Applicant: NANYA TECHNOLOGY CORPORATION, New Taipei (TW)

(72) Inventors: Ting-Cih Kang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 14 days.

(21) Appl. No.: 17/105,480

(22) Filed: Nov. 25, 2020

(65) Prior Publication Data
US 2021/0082834 A1   Mar. 18, 2021

Related U.S. Application Data

(62) Division of application No. 16/544,887, filed on Aug. 19, 2019, now Pat. No. 10,886,236.

(51) Int. Cl.
*H01L 23/528* (2006.01)
*H01L 23/552* (2006.01)
*H01L 23/522* (2006.01)

(52) U.S. Cl.
CPC ........ *H01L 23/552* (2013.01); *H01L 23/5226* (2013.01); *H01L 23/5283* (2013.01)

(58) Field of Classification Search
CPC ... H01L 23/5226; H01L 23/52; H01L 23/528; H01L 23/5283
See application file for complete search history.

(56) References Cited

U.S. PATENT DOCUMENTS

| 6,492,716 | B1 | 12/2002 | Bothra et al. |
| 9,865,482 | B2 | 1/2018 | Lin et al. |
| 2015/0076665 | A1* | 3/2015 | Shiu ............... H01L 23/544 257/620 |
| 2017/0019990 | A1* | 1/2017 | Takemura ........ G01R 1/07342 |
| 2018/0061463 | A1* | 3/2018 | Park ................... G11C 7/12 |

* cited by examiner

*Primary Examiner* — Jae Lee
(74) *Attorney, Agent, or Firm* — CKC & Partners Co., LLC

(57) ABSTRACT

An interconnect structure includes a first and second insulating layer, a first and second conductive line, and a first, second, and third conductive via. The second insulating layer is disposed on the first insulating layer. The first conductive line including a first and second portion, and the first, second, and the third conductive vias are embedded in the first insulating layer. The second conductive line including a third portion and fourth portion is embedded in the second insulating layer. The first conductive via connects the first and third portions. The second conductive via connects the second and third portions. The third conductive via connects the second and fourth portions. A first cross-sectional area surrounded by the first, second, third portions, the first, second conductive vias is substantially equal to a second cross-sectional area surrounded by the second, third, fourth portions, the second, third conductive vias.

9 Claims, 13 Drawing Sheets

INTERCONNECT STRUCTURE

CROSS-REFERENCE TO RELATED APPLICATION

The present application is a Divisional Application of the U.S. application Ser. No. 16/544,887, filed on Aug. 19, 2019.

BACKGROUND

Field of Invention

The present disclosure relates to an interconnect structure. More particularly, the present disclosure relates to an interconnect structure having a circuit structure that can prevent the noise interference from other circuit element.

Description of Related Art

Integrated circuits (ICs) are typically fabricated with multiple levels of patterned conductive lines, electrically separated from one another by the interlayer dielectric layer containing conductive vias at selected locations to provide electrical connections between levels of the patterned conductive lines. However, other circuit element, such as radio-frequency (RF) circuit, may generate the electromagnetic interference (EMI) to influence the operation of the integrated circuits. In view of this, it is necessary to develop a new circuit structure to prevent the noise interference.

SUMMARY

The present disclosure provides an interconnect structure including a first insulating layer, a first conductive line, a second insulating layer, a second conductive line, a first conductive via, a second conductive via, and a third conductive via. The first conductive line is embedded in the first insulating layer and includes a first portion and a second portion. The second insulating layer is disposed on the first insulating layer. The second conductive line is embedded in the second insulating layer and includes a third portion and a fourth portion. The first conductive via, the second conductive via, and the third conductive via are embedded in the first insulating layer. The first conductive via connects the first portion and the third portion. The second conductive via connects the second portion and the third portion. The third conductive via connects the second portion and the fourth portion. A first cross-sectional area surrounded by the first portion, the second portion, the third portion, the first conductive via, and the second conductive via is substantially equal to a second cross-sectional area surrounded by the second portion, the third portion, the fourth portion, the second conductive via, and third conductive via.

In some embodiments, the first cross-sectional area is substantially a height between the first portion and the third portion multiplied by a distance between the first conductive via and the second conductive via.

In some embodiments, the second cross-sectional area is substantially a height between the second portion and the fourth portion multiplied by a distance between the second conductive via and the third conductive via.

In some embodiments, a height between the first portion and the third portion is substantially equal to a distance between the first conductive via and the second conductive via.

In some embodiments, a height between the second portion and the fourth portion is substantially equal to a distance between the second conductive via and the third conductive via.

In some embodiments, a height between the first portion and the third portion is larger than a distance between the first conductive via and the second conductive via.

In some embodiments, a height between the second portion and the fourth portion is larger than a distance between the second conductive via and the third conductive via.

In some embodiments, a height between the first portion and the third portion is smaller than a distance between the first conductive via and the second conductive via.

In some embodiments, a height between the second portion and the fourth portion is smaller than a distance between the second conductive via and the third conductive via.

The present disclosure provides an interconnect structure including a first insulating layer, a first conductive line, a second insulating layer, a second conductive line, a third insulating layer, a third conductive line, a first conductive via, a second conductive via, a third conductive via and a fourth conductive via. The first conductive line is embedded in the first insulating layer. The second insulating layer is disposed on the first insulating layer. The second conductive line is embedded in the second insulating layer and includes a first portion, a second portion, and a third portion. The third insulating layer is disposed on the second insulating layer. The third conductive line embedded in the third insulating layer. The first conductive via and the second conductive via are embedded in the first insulating layer. The first conductive via connects the first conductive line and the first portion. The second conductive via connecting first conductive line and the second portion. The third conductive via and the fourth conductive via are embedded in the second insulating layer. The third conductive via connects the first portion and the third conductive line. The fourth conductive via connects the third portion and the third conductive line. A first cross-sectional area surrounded by the first conductive line, the first conductive via, the second conductive via, the first portion, and the second portion is substantially equal to a second cross-sectional area surrounded by the first portion, the third portion, the third conductive via, the fourth conductive via, and the third conductive line.

In some embodiments, the first cross-sectional area is substantially a height between the first conductive line and the first portion multiplied by a distance between the first conductive via and the second conductive via.

In some embodiments, the first cross-sectional area is substantially a height between the first conductive line and the second portion multiplied by a distance between the first conductive via and the second conductive via.

In some embodiments, the second cross-sectional area is substantially a height between the first portion and the third conductive line multiplied by a distance between the third conductive via and the fourth conductive via.

In some embodiments, the second cross-sectional area is substantially a height between the third portion and the third conductive line multiplied by a distance between the third conductive via and the fourth conductive via.

In some embodiments, a height between the first conductive line and the first portion is substantially equal to a distance between the first conductive via and the second conductive via.

In some embodiments, a height between the first portion and the third conductive line is substantially equal to a distance between the third conductive via and the fourth conductive via.

In some embodiments, a height between the first conductive line and the first portion is smaller than a distance between the first conductive via and the second conductive via.

In some embodiments, a height between the first conductive line and the first portion is larger than a distance between the first conductive via and the second conductive via.

In some embodiments, a height between the first portion and the third conductive line is smaller than a distance between the third conductive via and the fourth conductive via.

In some embodiments, a height between the first portion and the third conductive line is larger than a distance between the third conductive via and the fourth conductive via.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
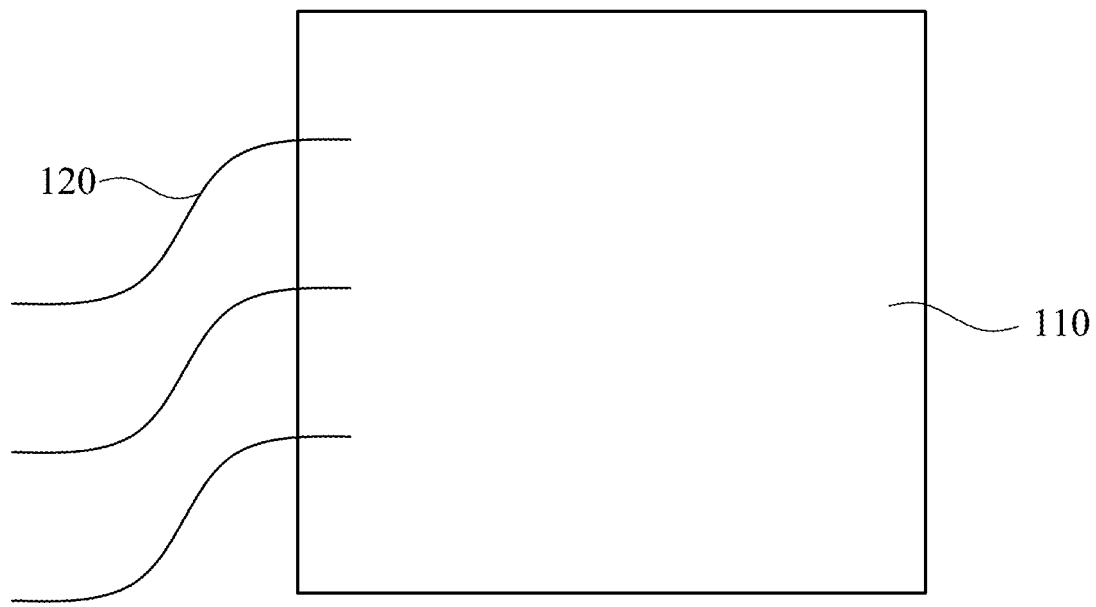
FIG. 1 is a semiconductor structure in accordance with some embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language).

FIG. 1 is a semiconductor structure 100 in accordance with some embodiments of the present disclosure. The semiconductor structure 100 includes a chip 110 and wires 120 bonded to the chip 110. The chip 110 may include an interconnect structure, a transistor, a capacitor, etc. When the chip 110 is operated, the wires 120 (or other circuit element) may generate noise to interfere the circuit element operation in the chip 110, such as the operation of interconnect structure. Therefore, it is necessary to design an interconnect structure having a new circuit structure to prevent the noise interference from the wires 120 (or other circuit element).

Figure 2:
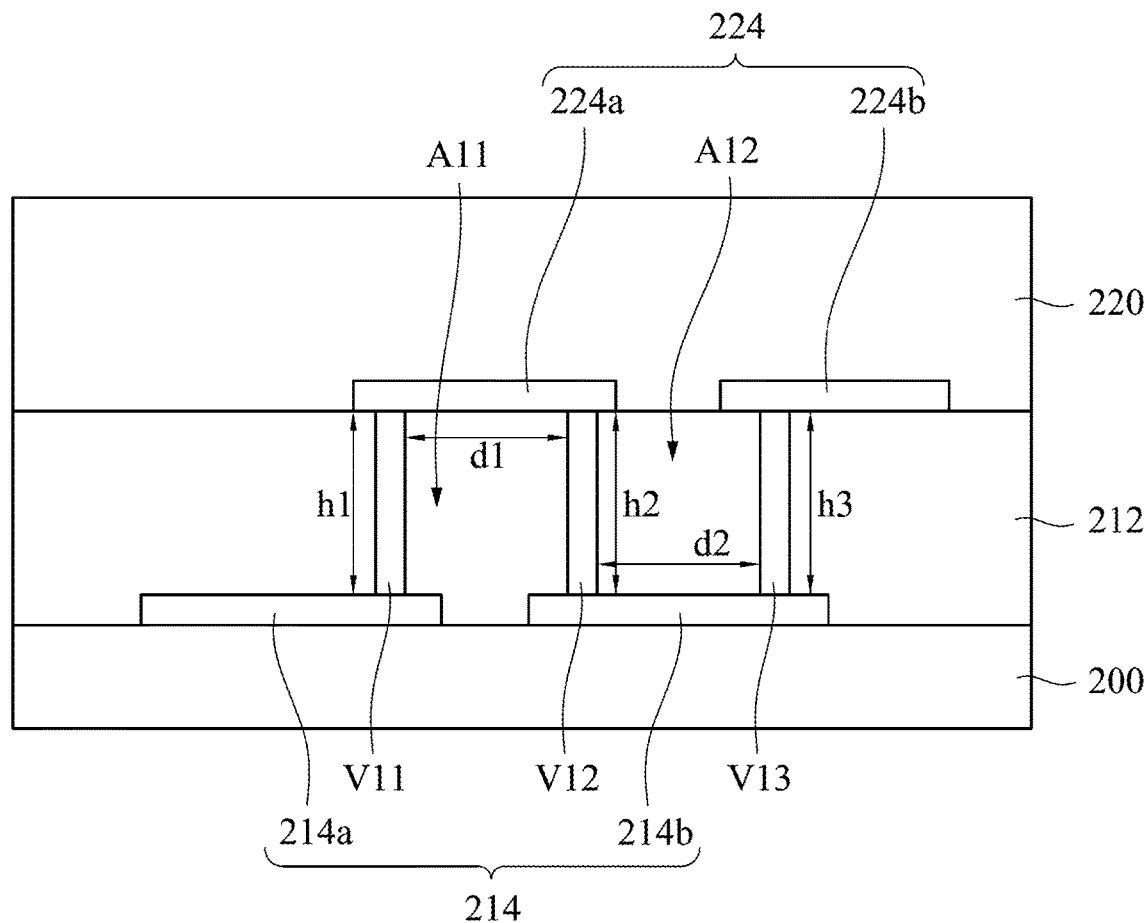
FIGS. 2, 4-6, and 8-13 are cross-sectional views schematically illustrating an interconnect structure in accordance with various embodiments of the present disclosure.

In one aspect of the present disclosure, an interconnect structure is disclosed. FIG. 2 is a cross-sectional view schematically illustrating an interconnect structure IS1 in accordance with various embodiments of the present disclosure. The interconnect structure IS1 includes a substrate 200, a first insulating layer 212, a second insulating layer 220, a first conductive line 214, a second conductive line 224, a first conductive via V11, a second conductive via V12, and a third conductive via V13. The first insulating layer 212 is disposed on the substrate 200. The substrate 200 may be a semiconductor substrate, such as a bulk semiconductor, a semiconductor-on-insulator (SOI) substrate, or the like. The substrate 200 may be a wafer, such as a silicon wafer. An SOI substrate includes a layer of a semiconductor material formed on an insulator layer. In some embodiments, semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 200 may include semiconductor elements such as transistors, capacitors, but not limited thereto.

As shown in FIG. 2, the second insulating layer 220 is disposed on the first insulating layer 212. The first conductive line 214 is embedded in the first insulating layer 212 and in contact with the substrate 200, and includes a first portion 214a and a second portion 214b. The second conductive line 224 is embedded in the second insulating layer 220 and in contact with the first insulating layer 212, and includes a third portion 224a and a fourth portion 224b. The first conductive via V11, the second conductive via V12, and the third conductive via V13 are embedded in the first insulating layer 212. The first conductive via V11 connects the first portion 214a and the third portion 224a. The second conductive via V12 connects the second portion 214b and the third portion 224a. The third conductive via V13 connects the second portion 214b and the fourth portion 224b.

Still referring to FIG. 2, a first cross-sectional area A11 surrounded by the first portion 214a, the second portion 214b, the third portion 224a, the first conductive via V11, and the second conductive via V12 is substantially equal to a second cross-sectional area A12 surrounded by the second portion 214b, the third portion 224a, the fourth portion 224b, the second conductive via V12, and third conductive via V13. More specifically, the first cross-sectional area A11 is surrounded by the edges of the first portion 214a, the second portion 214b, the third portion 224a, the first conductive via V11, the second conductive via V12, and the substrate 200, and the second cross-sectional area A12 is surrounded by the edges of the second portion 214b, the third portion 224a, the fourth portion 224b, the second conductive via V12, the third conductive via V13, and the second insulating layer 220.

In some embodiments, the thickness of the first conductive line 214 is much less than the thickness of the first insulating layer 212. In other words, the first conductive line 214 is relatively thin, and thus its thickness can be ignored.

In some embodiments, the first cross-sectional area A11 is substantially a height h1 between the first portion 214a and the third portion 224a multiplied by a distance d1 between the first conductive via V11 and the second conductive via V12. In some embodiments, the first cross-sectional area A11 is substantially a height h2 between the second portion 214b and the third portion 224a multiplied by the distance d1 between the first conductive via V11 and the second conductive via V12. In some embodiments, the second cross-sectional area A12 is substantially a height h3 between the second portion 214b and the fourth portion 224b multiplied by a distance d2 between the second conductive via V12 and the third conductive via V13. In some embodiments, the second cross-sectional area A12 is substantially the height h2 between the second portion 214b and the third portion 224a multiplied by the distance d2 between the second conductive via V12 and the third conductive via V13.

As shown in FIG. 2, the height h1 between the first portion 214a and the third portion 224a is substantially equal to the distance d1 between the first conductive via V11 and the second conductive via V12. The height h2 between the second portion 214b and the third portion 224a is substantially equal to the distance d1 between the first conductive via V11 and the second conductive via V12. The height h3 between the second portion 214b and the fourth portion 224b is substantially equal to the distance d2 between the second conductive via V12 and the third conductive via V13. The height h2 between the second portion 214b and the third portion 224a is substantially equal to the distance d2 between the second conductive via V12 and the third conductive via V13.

Figure 3:
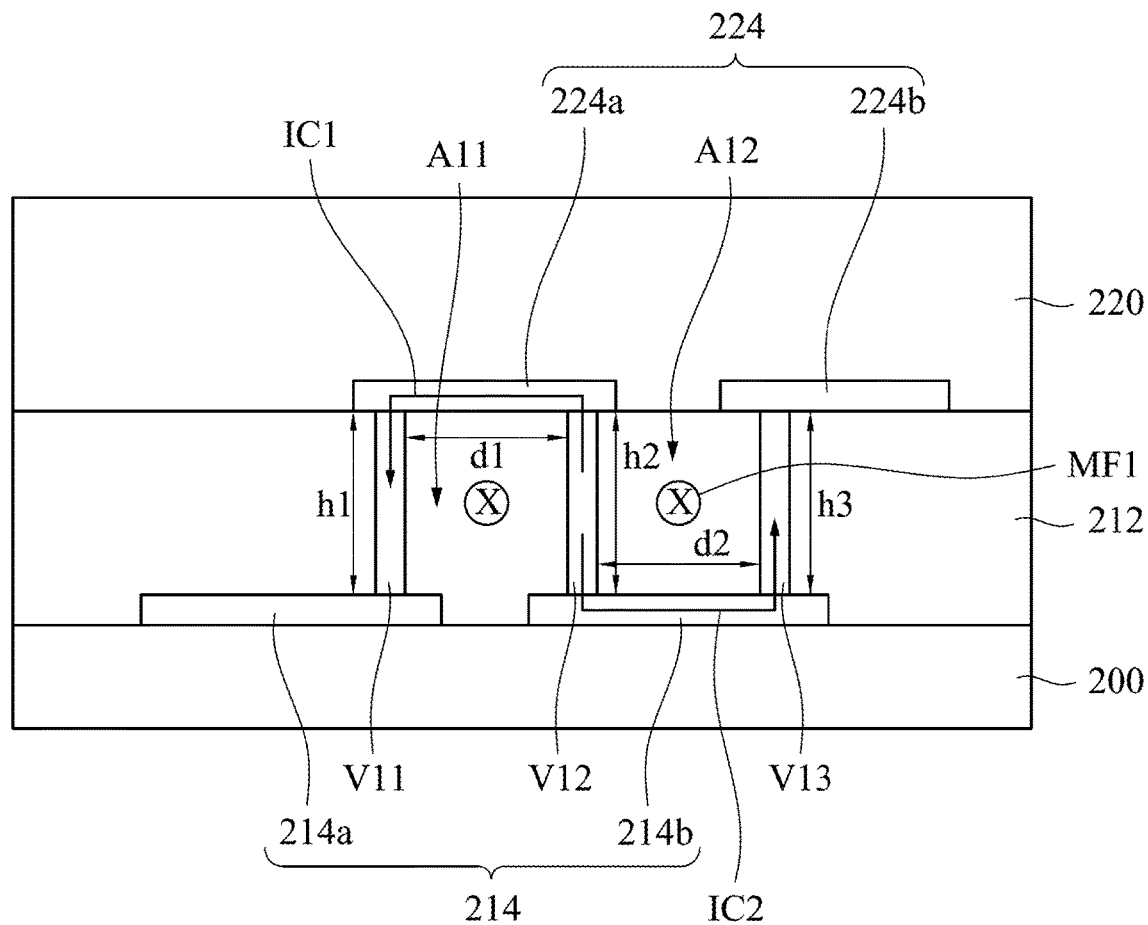
FIG. 3 schematically illustrates the direction of induced currents when the interconnect structure shown in FIG. 2 is in a changing magnetic field.

Please refer to FIG. 3. FIG. 3 schematically illustrates the direction of induced currents when the interconnect structure IS1 shown in FIG. 2 is in a changing magnetic field MF1. In some embodiments, the interconnect structure IS1 is disposed in a semiconductor structure, such as chip, and the changing magnetic field MF1 may generated by a circuit element (such as radio-frequency (RF) circuit). For example, the direction of the changing magnetic field MF1 is into the plane as shown in FIG. 3. The magnitude and direction of induced currents can be known by Lenz's law, which states that the direction of the current induced in a conductor by a changing magnetic field is such that the magnetic field created by the induced current opposes the initial changing magnetic field, and is shown by the negative sign in Faraday's law of induction:

$$\varepsilon = -\frac{\Delta \Phi_B}{\Delta t}$$

which indicates that the induced electromotive force ε and the rate of change in magnetic flux $\phi_B$ have opposite signs. The magnetic flux is shown by the following formula:

$$\Phi_B = \int B \cdot dA,$$

in which B represents a magnetic field, and A represents an area perpendicular to the magnetic field. Therefore, according to Lenz's law, it can be known that the direction of an induced current IC1 flowing through the first conductive via V11, second conductive via V12, and third portion 224a is different from the direction of an induced current IC2 flowing through the second conductive via V12, third conductive via V13, and second portion 214b. Moreover, because the first cross-sectional area A11 and second cross-sectional area A12 are substantially equal, the induced current IC1 and induced current IC2 have the same magnitude. Therefore, the induced current IC1 can be offset by the induced current IC2, and thus the changing magnetic field MF1 would not influence the operation of the first conductive line 214, the second conductive line 224, the first conductive via V11, the second conductive via V12, and the third conductive via V13. Based on such circuit structure shown in FIG. 3, the interconnect structure IS1 can prevent the noise interference from other circuit element (such as wire).

Figure 4:
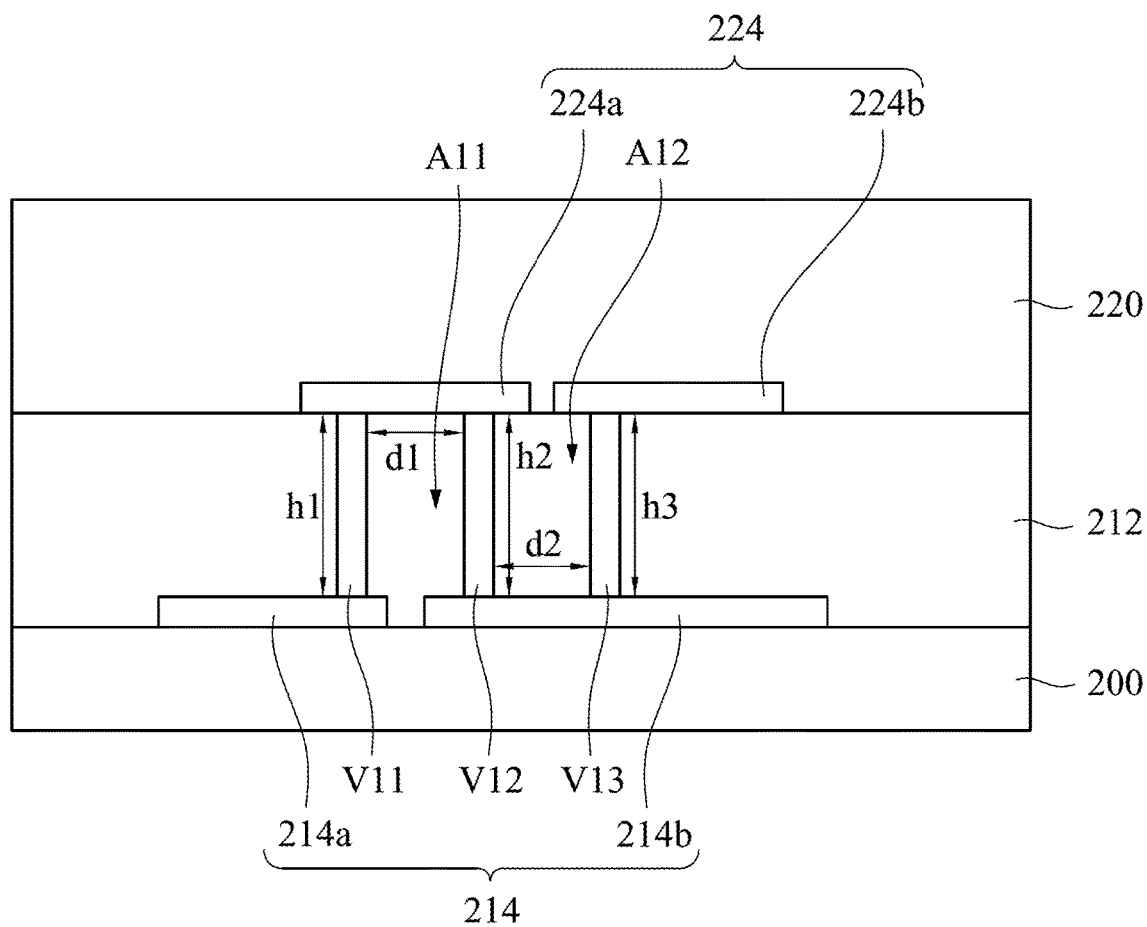

FIG. 4 is a cross-sectional view schematically illustrating an interconnect structure IS2 in accordance with various embodiments of the present disclosure. The difference between FIG. 4 and FIG. 2 is that, in the interconnect structure IS2, the height h1 is larger than the distance d1, the height h2 is larger than the distance d1, the height h3 is larger than the distance d2, and the height h2 is larger than the distance d2.

Figure 5:
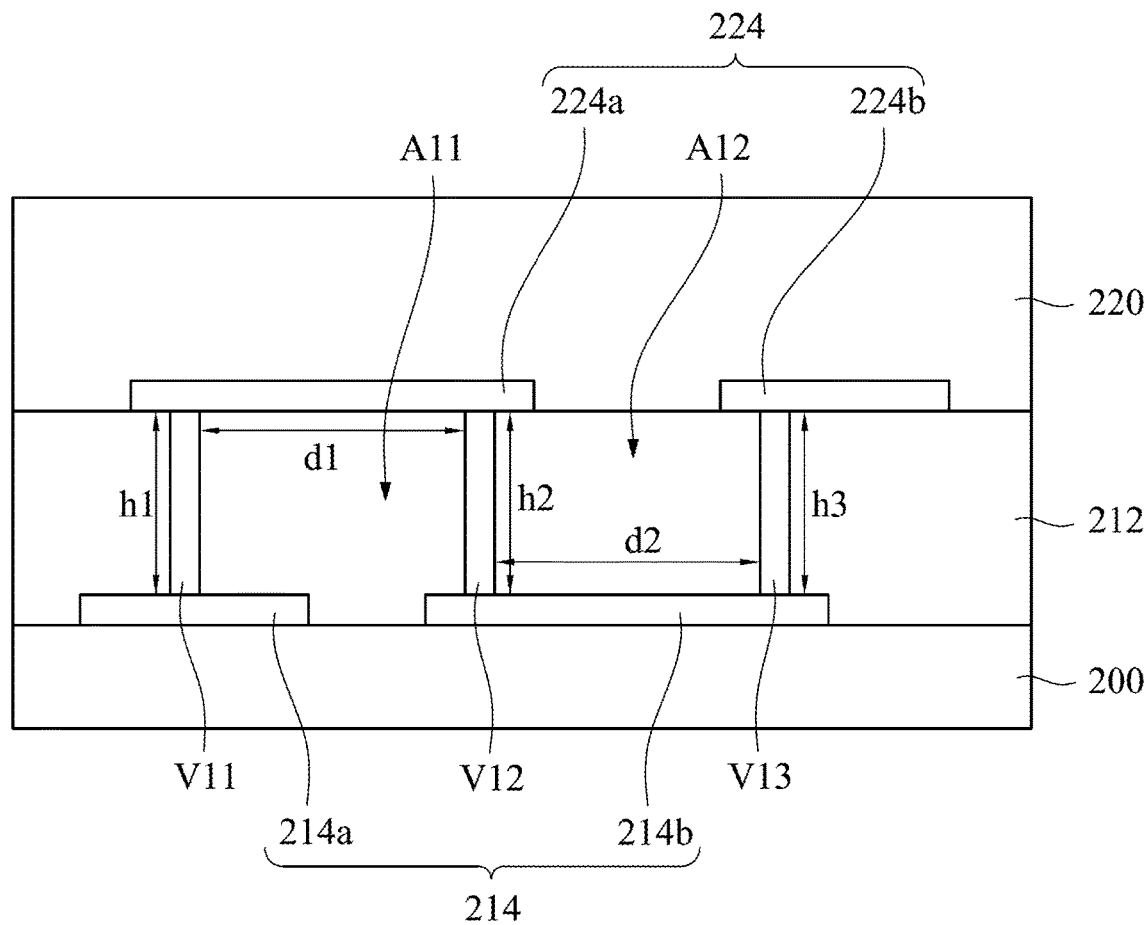

FIG. 5 is a cross-sectional view schematically illustrating an interconnect structure IS3 in accordance with various embodiments of the present disclosure. The difference between FIG. 5 and FIG. 2 is that, in the interconnect structure IS3, the height h1 is smaller than the distance d1, the height h2 is smaller than the distance d1, the height h3 is smaller than the distance d2, and the height h2 is smaller than the distance d2.

Figure 6:
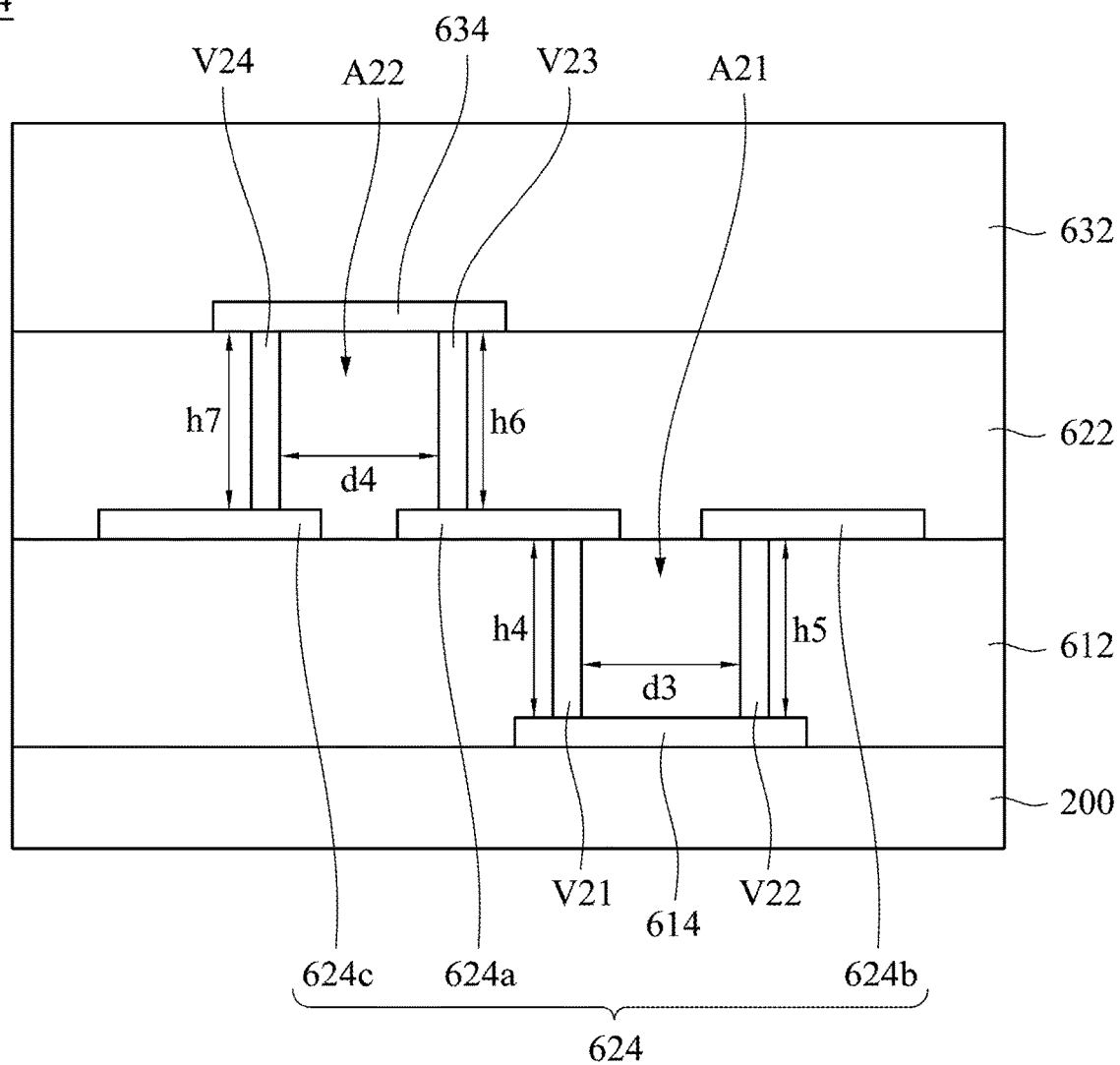

In another aspect of the present disclosure, an interconnect structure is disclosed. FIG. 6 is a cross-sectional view schematically illustrating an interconnect structure in accordance with various embodiments of the present disclosure. The interconnect structure IS4 includes a substrate 200, a first insulating layer 612, a second insulating layer 622, a third insulating layer 632, a first conductive line 614, a second conductive line 624, a third conductive line 634, a first conductive via V21, a second conductive via V22, a third conductive via V23 and a fourth conductive via V24. The first insulating layer 612 is disposed on the substrate 200. The second insulating layer 622 is disposed on the first insulating layer 612. The third insulating layer 632 is disposed on the second insulating layer 622.

As shown in FIG. 6, the first conductive line 614 is embedded in the first insulating layer 612 and in contact with the substrate 200. The second conductive line 624 is embedded in the second insulating layer 622 and in contact with the first insulating layer 612, and includes a first portion 624a, a second portion 624b, and a third portion 624c. The third conductive line 634 is embedded in the third insulating layer 632 and in contact with the second insulating layer 622. The first conductive via V21 and the second conductive via V22 are embedded in the first insulating layer 612. The first conductive via V21 connects the first conductive line 614 and the first portion 624a. The second conductive via V22 connects the first conductive line 614 and the second portion 624b. The third conductive via V23 and the fourth conductive via V24 are embedded in the second insulating layer 622. The third conductive via V23 connects the first portion 624a and the third conductive line 634. The fourth conductive via V24 connects the third portion 624c and the third conductive line 634.

Still referring to FIG. 6, a first cross-sectional area A21 surrounded by the first conductive line 614, the first conductive via V21, the second conductive via V22, the first portion 624a, and the second portion 624b is substantially equal to a second cross-sectional area A22 surrounded by the first portion 624a, the third portion 624c, the third conductive via V23, the fourth conductive via V24, and the third conductive line 634. More specifically, the first cross-sectional area A21 is surrounded by the edges of the first conductive line 614, the first conductive via V21, the second conductive via V22, the first portion 624a, the second portion 624b, and the second insulating layer 622, and the second cross-sectional area A22 is surrounded by the edges of the first portion 624a, the third portion 624c, the third conductive via V23, the fourth conductive via V24, the third conductive line 634, and the first insulating layer 612.

In some embodiments, the thickness of the second conductive line 624 is much less than the thickness of the second insulating layer 622. In other words, the second conductive line 624 is relatively thin, and thus its thickness can be ignored. In some embodiments, the first cross-sectional area A21 is substantially a height h4 between the first conductive line 614 and the first portion 624a multiplied by a distance d3 between the first conductive via V21 and the second conductive via V22. In some embodiments, the first cross-sectional area A21 is substantially a height h5 between the first conductive line 614 and the second portion 624b multiplied by the distance d3 between the first conductive via V21 and the second conductive via V22. In some embodiments, the second cross-sectional area A22 is substantially a height h6 between the first portion 624a and the third conductive line 634 multiplied by a distance d4 between the third conductive via V23 and the fourth conductive via V24. In some embodiments, the second cross-sectional area A22 is substantially a height h7 between the third portion 624c and the third conductive line 634 multiplied by the distance d4 between the third conductive via V23 and the fourth conductive via V24.

As shown in FIG. 6, the height h4 between the first conductive line 614 and the first portion 624a is substantially equal to the distance d3 between the first conductive via V21 and the second conductive via V22, the height h5 between the first conductive line 614 and the second portion 624b is substantially equal to the distance d3 between the first conductive via V21 and the second conductive via V22, the height h6 between the first portion 624a and the third conductive line 634 is substantially equal to the distance d4 between the third conductive via V23 and the fourth conductive via V24, and the height h7 between the third portion 624c and the third conductive line 634 is substantially equal to the distance d4 between the third conductive via V23 and the fourth conductive via V24.

Figure 7:
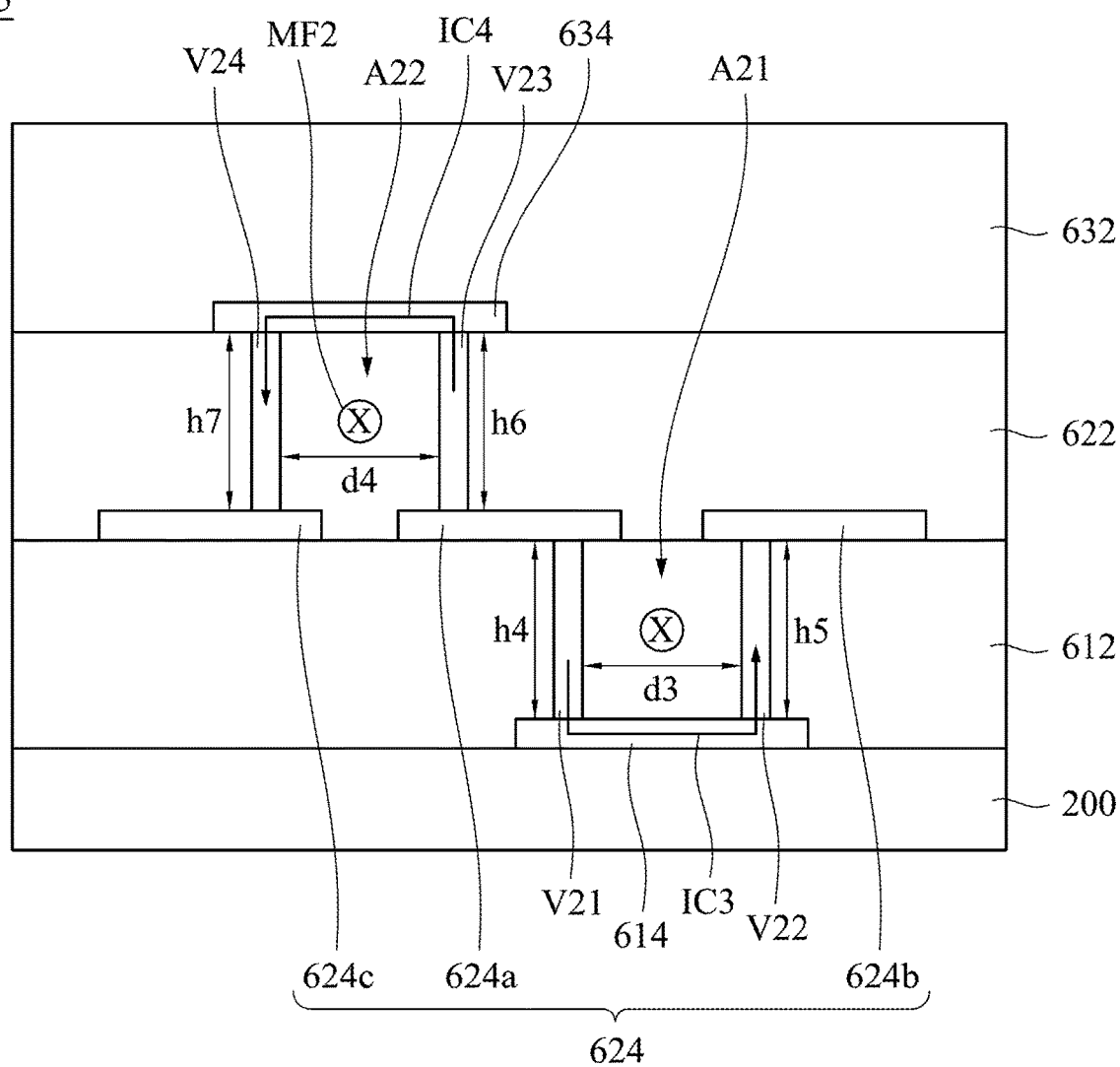
FIG. 7 schematically illustrates the direction of induced currents when the interconnect structure shown in FIG. 6 is in a changing magnetic field.

Please refer to FIG. 7. FIG. 7 schematically illustrates the direction of induced currents when the interconnect structure IS4 shown in FIG. 6 is in a changing magnetic field MF2. In some embodiments, the interconnect structure IS4 is disposed in a semiconductor structure, such as chip, and the changing magnetic field MF2 may generated by a circuit element (such as wire) bonded to the chip. For example, the direction of the changing magnetic field MF2 is into the plane as shown in FIG. 7.

According to Lenz's law, it can be known that the direction of an induced current IC3 flowing through the first conductive line 614, the first conductive via V21, and the second conductive via V22 is different from the direction of an induced current IC4 flowing through the third conductive via V23, the fourth conductive via V24, and the third conductive line 634. Moreover, because the first cross-sectional area A21 and second cross-sectional area A22 are substantially equal, the induced current IC3 and induced current IC4 have the same magnitude. Therefore, the induced current IC3 can be offset by the induced current IC4, and thus the changing magnetic field MF2 would not influence the operation of the first conductive line 614, the second conductive line 624, the third conductive line 634, the first conductive via V21, the second conductive via V22, the third conductive via V23, and the fourth conductive via V24. Based on such circuit structure shown in FIG. 7, the interconnect structure IS4 can prevent the noise interference from other circuit element (such as wire).

Figure 8:
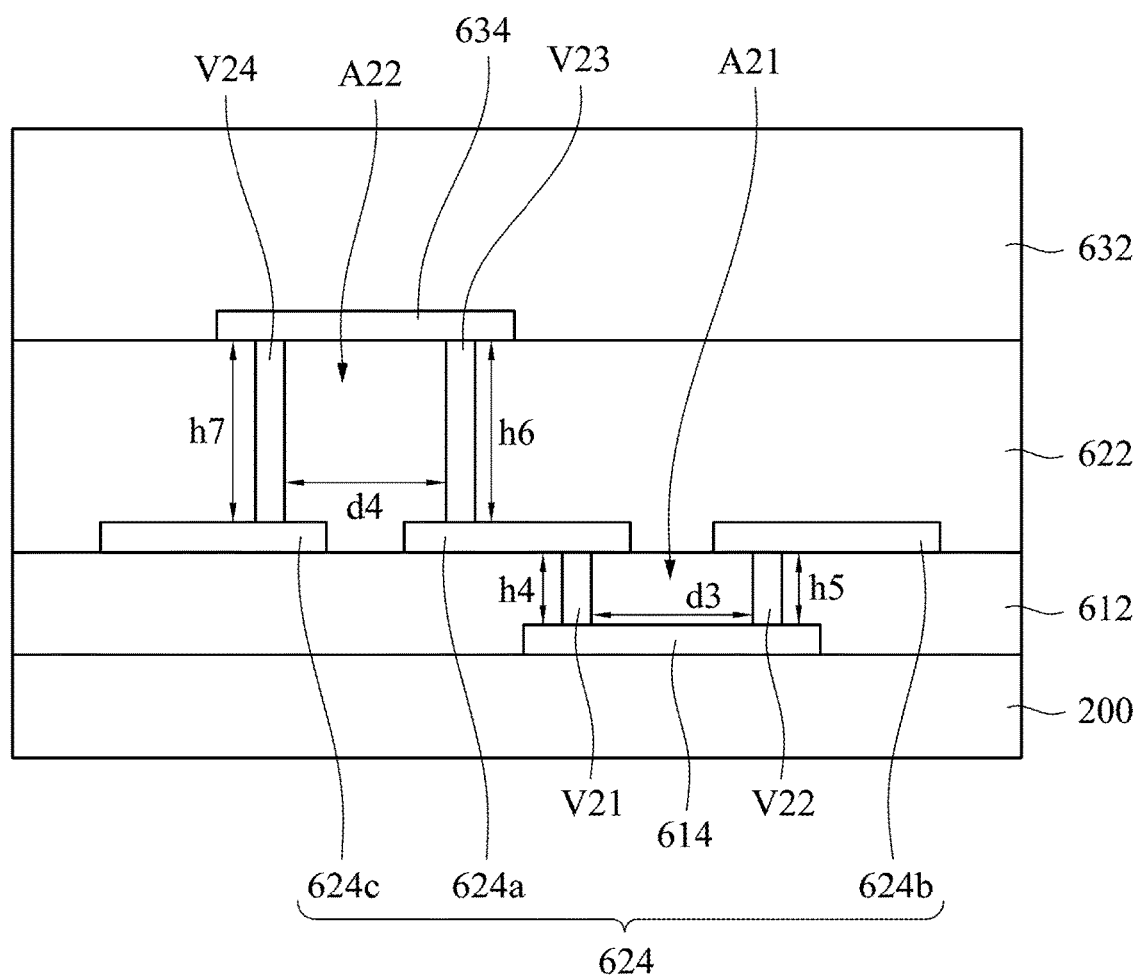

FIG. 8 is a cross-sectional view schematically illustrating an interconnect structure IS5 in accordance with various embodiments of the present disclosure. The difference between FIG. 8 and FIG. 6 is that, in the interconnect structure IS5, the height between h4 is smaller than the distance d3, and the height h5 is smaller than the distance d3.

Figure 9:
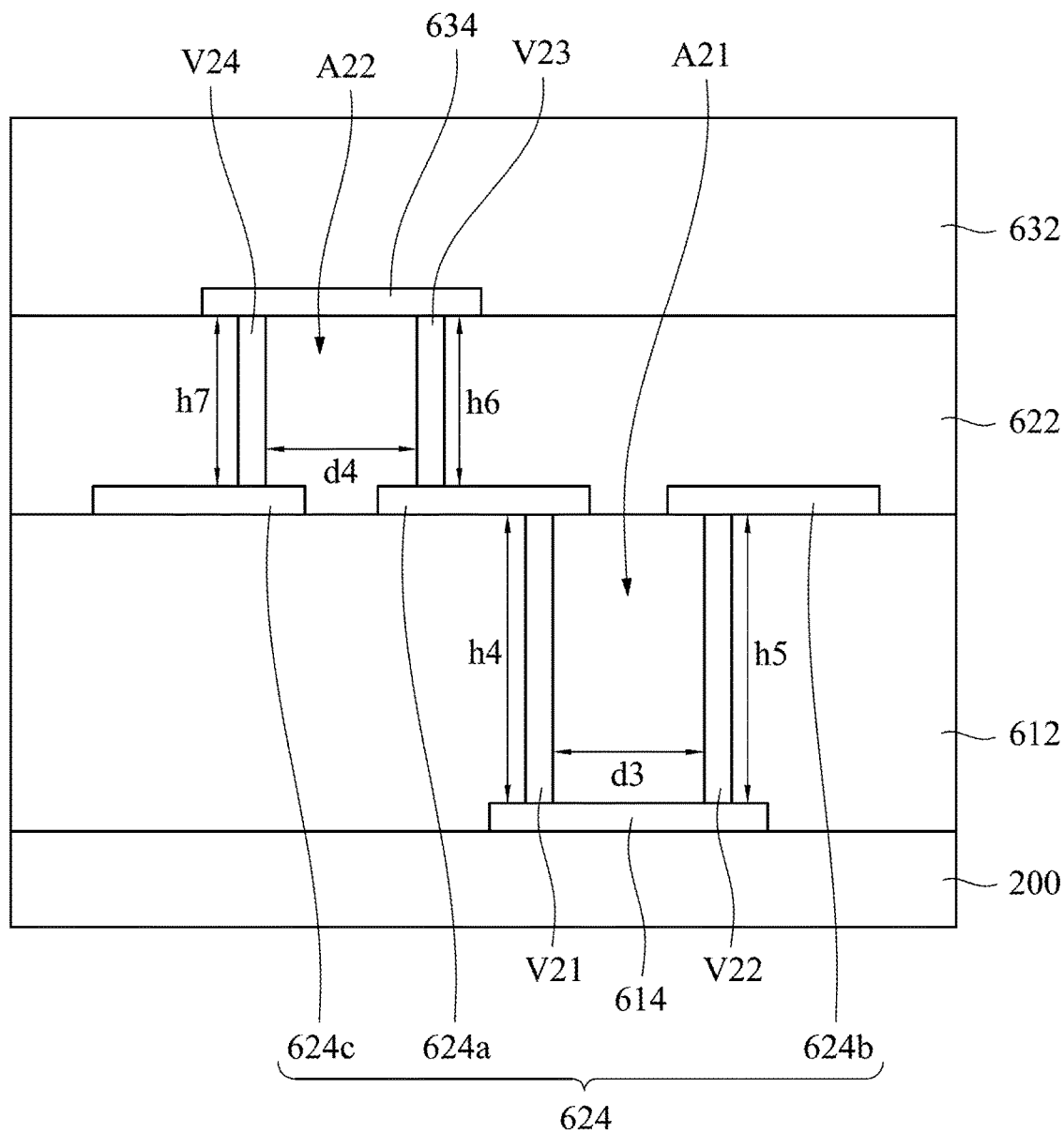

FIG. 9 is a cross-sectional view schematically illustrating an interconnect structure IS6 in accordance with various embodiments of the present disclosure. The difference between FIG. 9 and FIG. 6 is that, in the interconnect structure IS6, the height between h4 is larger than the distance d3, and the height h5 is larger than the distance d3.

Figure 10:
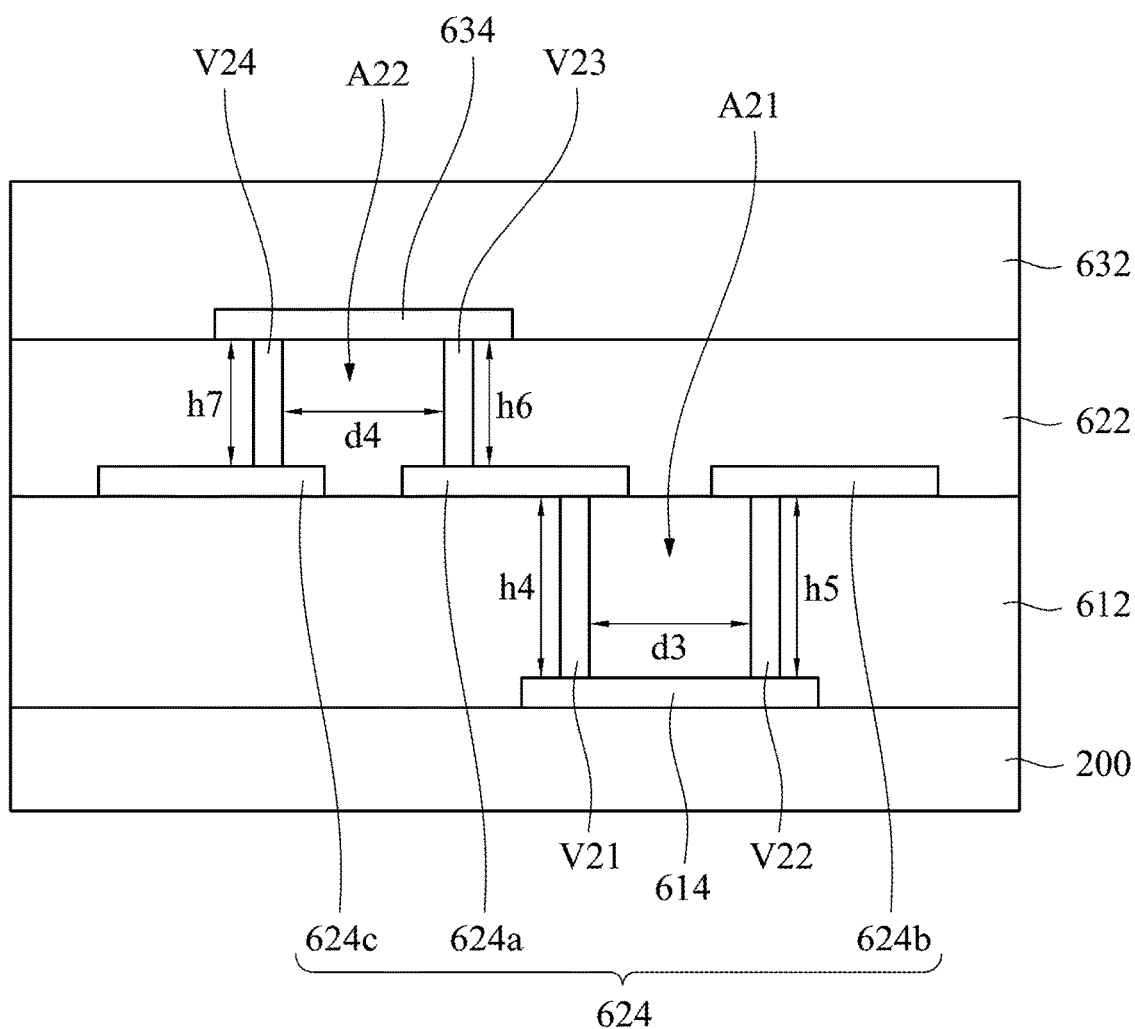

FIG. 10 is a cross-sectional view schematically illustrating an interconnect structure IS7 in accordance with various embodiments of the present disclosure. The difference between FIG. 10 and FIG. 6 is that, in the interconnect structure IS7, the height h6 is smaller than the distance d4, and the height h7 is smaller than the distance d4.

Figure 11:
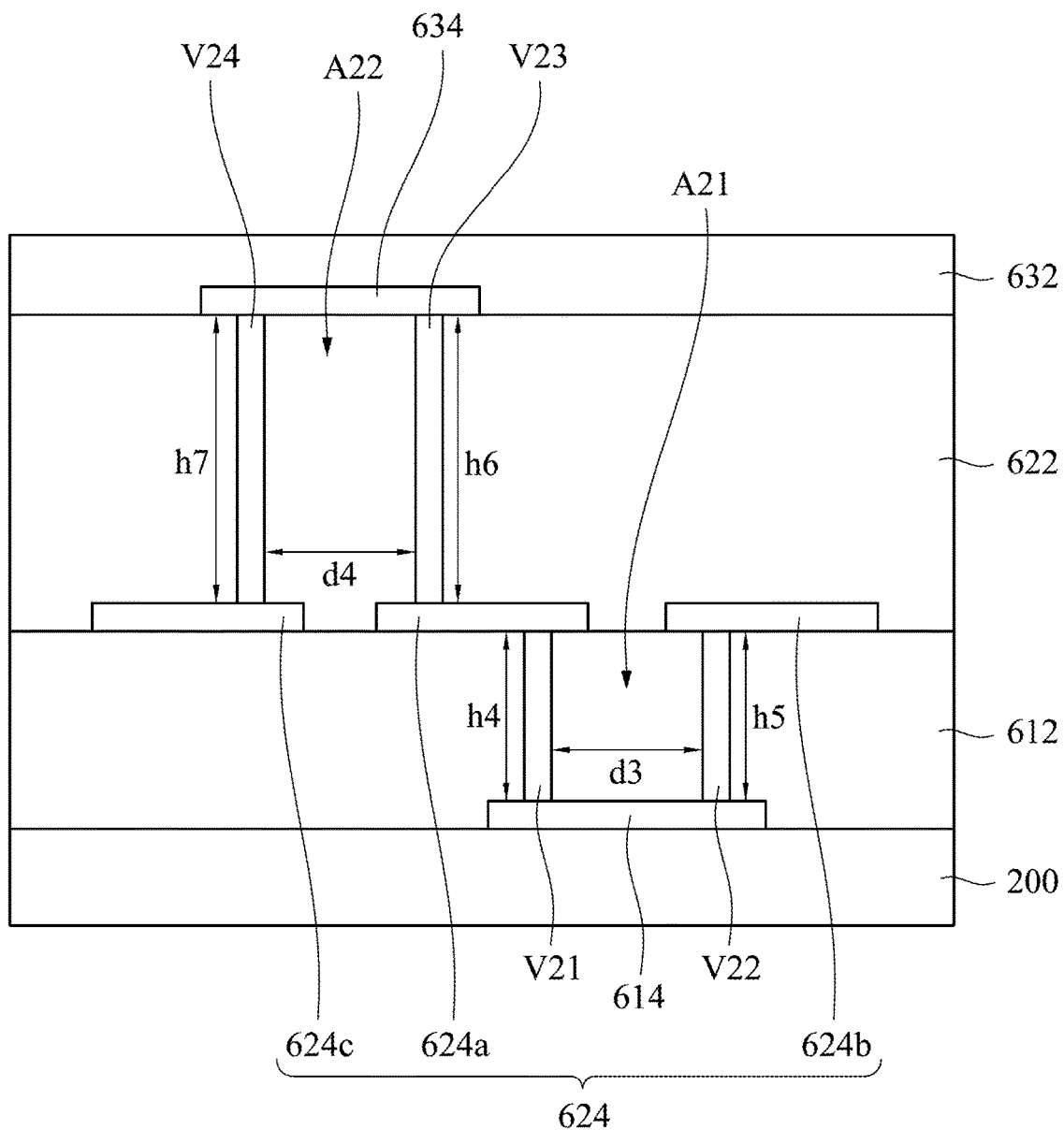

FIG. 11 is a cross-sectional view schematically illustrating an interconnect structure IS8 in accordance with various embodiments of the present disclosure. The difference between FIG. 11 and FIG. 6 is that, in the interconnect structure IS8, the height h6 is larger than the distance d4, and the height h7 is larger than the distance d4.

Figure 12:
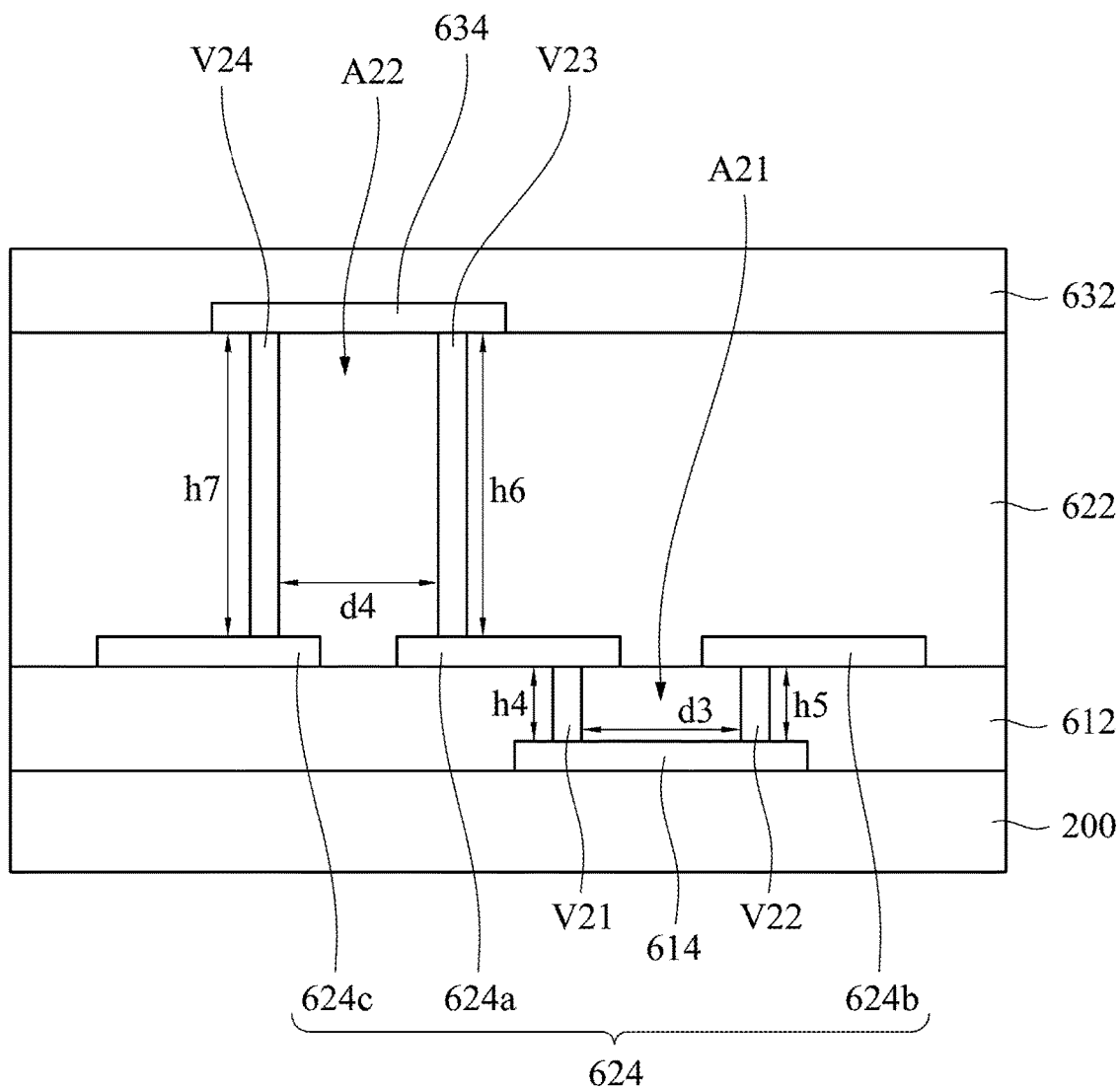

FIG. 12 is a cross-sectional view schematically illustrating an interconnect structure IS9 in accordance with various embodiments of the present disclosure. The difference between FIG. 12 and FIG. 6 is that, in the interconnect structure IS9, the height between h4 is smaller than the distance d3, the height h5 is smaller than the distance d3, the height h6 is larger than the distance d4, and the height h7 is larger than the distance d4.

Figure 13:
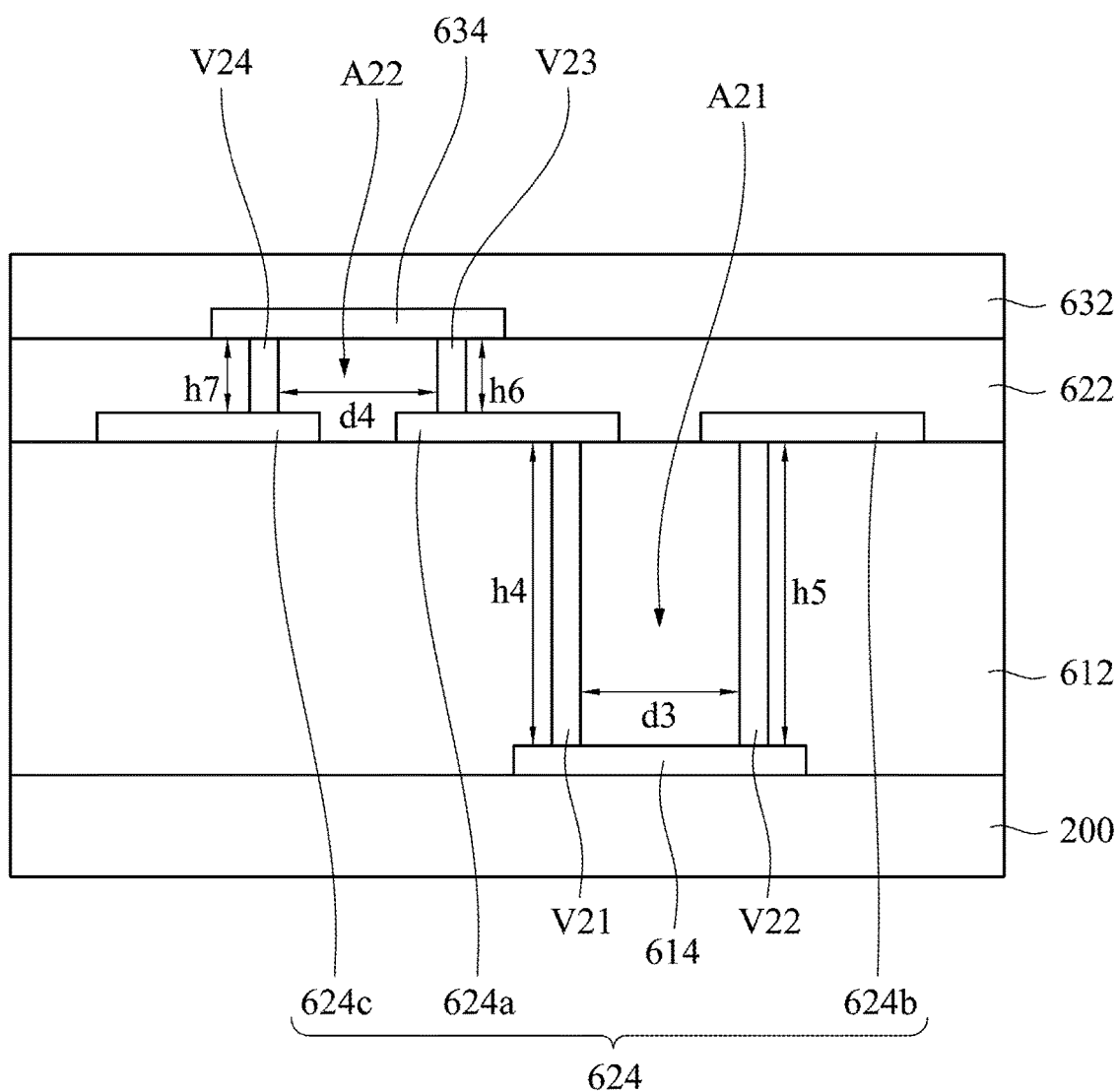

FIG. 13 is a cross-sectional view schematically illustrating an interconnect structure IS10 in accordance with various embodiments of the present disclosure. The difference between FIG. 13 and FIG. 6 is that, in the interconnect structure IS10, the height between h4 is larger than the distance d3, the height h5 is larger than the distance d3, the height h6 is smaller than the distance d4, and the height h7 is smaller than the distance d4.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An interconnect structure, comprising:
a first insulating layer;
a first conductive line embedded in the first insulating layer, the first conductive line comprising a first portion and a second portion;
a second insulating layer disposed on the first insulating layer;

a second conductive line embedded in the second insulating layer, the second conductive line comprising a third portion and a fourth portion; and a first conductive via, a second conductive via, and a third conductive via embedded in the first insulating layer, the first conductive via connecting the first portion and the third portion, the second conductive via connecting the second portion and the third portion, the third conductive via connecting the second portion and the fourth portion, wherein a first cross-sectional area surrounded by the first portion, the second portion, the third portion, the first conductive via, and the second conductive via is substantially equal to a second cross-sectional area surrounded by the second portion, the third portion, the fourth portion, the second conductive via, and third conductive via.

2. The interconnect structure of claim 1, wherein the first cross-sectional area is substantially a height between the first portion and the third portion multiplied by a distance between the first conductive via and the second conductive via.

3. The interconnect structure of claim 1, wherein the second cross-sectional area is substantially a height between the second portion and the fourth portion multiplied by a distance between the second conductive via and the third conductive via.

4. The interconnect structure of claim 1, wherein a height between the first portion and the third portion is substantially equal to a distance between the first conductive via and the second conductive via.

5. The interconnect structure of claim 1, wherein a height between the second portion and the fourth portion is substantially equal to a distance between the second conductive via and the third conductive via.

6. The interconnect structure of claim 1, wherein a height between the first portion and the third portion is larger than a distance between the first conductive via and the second conductive via.

7. The interconnect structure of claim 1, wherein a height between the second portion and the fourth portion is larger than a distance between the second conductive via and the third conductive via.

8. The interconnect structure of claim 1, wherein a height between the first portion and the third portion is smaller than a distance between the first conductive via and the second conductive via.

9. The interconnect structure of claim 1, wherein a height between the second portion and the fourth portion is smaller than a distance between the second conductive via and the third conductive via.

\* \* \* \* \*